(12) United States Patent
Fuchimukai (10) Patent No.: US 6,597,871 B2
(45) Date of Patent: Jul. 22, 2003

(54) DIGITAL CAMERA

(75) Inventor: Atsushi Fuchimukai, Tochigi (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 10/094,637

(22) Filed: Mar. 12, 2002

(65) Prior Publication Data

US 2002/0131776 A1 Sep. 19, 2002

(30) Foreign Application Priority Data

Mar. 16, 2001 (JP) ........................................ 2001-077117

(51) Int. Cl.[7] ................... G03B 7/26; G03B 17/00; H04N 5/225

(52) U.S. Cl. ................... 396/301; 396/542; 348/372; 348/374

(58) Field of Search ................................ 396/301, 419, 396/535, 539, 542; 348/207.99, 372, 373, 374

(56) References Cited

U.S. PATENT DOCUMENTS

| | | | | | |
|---|---|---|---|---|---|
| 6,020,719 | A | * | 2/2000 | Nishigaki et al. | 320/128 |
| 6,169,857 | B1 | * | 1/2001 | Kaneko | 396/301 |
| 6,219,495 | B1 | * | 4/2001 | Miyamoto et al. | 396/542 |
| 6,442,347 | B1 | * | 8/2002 | Ito | 396/539 |

* cited by examiner

*Primary Examiner*—Christopher Mahoney
(74) *Attorney, Agent, or Firm*—Greenblum & Bernstein, P.L.C.

(57) ABSTRACT

A digital camera includes a power supply battery; an electric double layer condenser which accumulates a charge of electricity supplied from the battery; and a power supply circuit board, connected to the power supply battery, provided on a bottom portion of the digital camera body and lying substantially in parallel with the bottom side of the digital camera body, the power supply circuit board being provided with a cut-away portion. The electric double layer condenser is located in the cut-away portion and protrudes from at least one of upper and lower surfaces of the power supply circuit board. The electric double layer condenser is electrically connected to the power supply circuit board.

4 Claims, 7 Drawing Sheets

Fig. 7

DIGITAL CAMERA

BACKGROUND OF THE INVENTION

1. Field of the Invention

The present invention relates to a digital camera in which a power supply circuit board with electric double layer condensers is provided in a camera body.

2. Description of the Related Art

Many components pertaining to a power source, incorporated in a camera body of a digital camera, are large. In particular, an electric double layer condenser which can accumulate a large quantity of electricity has a large surface area and a large thickness.

Consequently, a power supply circuit board on which the electric double layer condensers are mounted tends to be large in the horizontal direction. Moreover, as the electric double layer condenser is thick in the upward/downward directions, if the power supply circuit board having the electric double layer condensers is arranged in the camera body, the size of the camera body in the horizontal and upward/downward directions is increased.

Furthermore, the power supply circuit board produces noise which can have adverse influence on other electrical components provided in the digital camera.

SUMMARY OF THE INVENTION

The present invention provides a digital camera in which a camera body is made small in the horizontal direction by miniaturizing the power supply circuit board on which electric double layer condensers are mounted. Furthermore, the use of the electric double layer condensers does not increase the height of the camera body, and noise produced by the power supply circuit board has no adverse influence on other substrates (i.e., electrical components provided thereon).

For example, a digital camera is provided, the camera body including a power supply battery; an electric double layer condenser which accumulates a charge of electricity supplied from the battery; and a power supply circuit board, connected to the power supply battery, provided on a bottom portion of the camera body and lying substantially in parallel with the bottom side of the camera body, the power supply circuit board being provided with a cut-away portion. The electric double layer condenser is located in the cut-away portion and protrudes from at least one of upper and lower surfaces of the power supply circuit board. The electric double layer condenser is electrically connected to the power supply circuit board.

A main base-plate having a threaded-hole for securing a tripod can be arranged on the bottom of the camera body wherein the main base-plate lies on a plane parallel with the power supply circuit board. The threaded-hole and the electric double layer condenser are located at different positions with respect to the plane so as not to overlap each other in a direction normal to the plane. At least a part of the threaded-hole and the electric double layer condenser overlap each other in a direction parallel to the plane.

The electric double layer condenser can be provided as a plurality of electric double layer condensers which are provided around the threaded-hole. It is desirable for an upper surface of the power supply circuit board to be covered by a magnetically shielded plate.

The present disclosure relates to subject matter contained in Japanese Patent Application No. 2001-77117 (filed on Mar. 16, 2001) which is expressly incorporated herein by reference in its entirety.

BRIEF DESCRIPTION OF THE DRAWINGS

The invention will be discussed below with reference to the accompanying drawings, in which.

DESCRIPTION OF THE PREFERRED EMBODIMENT

Note that in the following description, the forward/rearward direction refers to the optical axis direction of a camera lens of a digital camera 1 shown in FIG. 1, the upward/downward direction refers to the vertical direction with respect to the digital camera 1 shown in FIG. 1, and the lateral direction refers to a direction perpendicular to the forward/rearward direction and perpendicular to the upward/downward of the digital camera 1.

The digital camera 1 has a camera body 2 which is provided therein with a support member 3 (FIG. 2) which is in turn provided on its lower surface with a mount frame 4 having a front surface inclined forwardly. Upper, intermediate and lower substrates 5, 6 and 7 which lie in substantially horizontal planes, with respect to the digital camera 1 shown in FIG. 1, are secured to the mount frame 4. As can be seen in FIG. 2, the widths of the three substrates 5, 6 and 7 in the forward/rearward direction are increasingly larger from the upper substrate 5 toward the lower substrate 7.

A video output terminal 8 and a connector 9 for communication with an external device are mounted to the upper surface of the intermediate substrate 6. A pair of front and rear CF card guides 10a and 10b, along which a CF card (Compact Flash sized I/O card) "A" can be inserted, and a CF card connector (not shown) are mounted to the lower surface of the lower substrate 7. The front and rear CF card guides 10a and 10b constitute a CF card receiving member (small memory card receiving member) 11.

The CF card connector is electrically connected to the lower substrate 7. An ejector button 12 is provided in rear portion of the rear CF card guide 10b. A CF card ejection mechanism including the ejector button 12 is per se known, wherein when the ejector button 12 is depressed in the left direction as shown in FIG. 1 (into the camera body), the CF card "A" inserted in the CF card receiving member 11 is disconnected from the CF card connector, so that the CF card "A" can be ejected from the CF card receiving member 11.

Front and rear securing members 13 are secured to the front and rear ends of the lower surface of the substrate 7. A first power supply circuit board 14 which is electrically connected to a power supply source (dry cell/power supply battery) is secured to the lower surfaces of the front and rear securing members 13. The first power supply circuit board 14 is provided on the lower surface thereof with a pair of front and rear PC card guides 15a and 15b, the length thereof being greater than that of the front and rear CF card guides 10a and 10b (see FIG. 1), and a PC card connector 16 which is electrically connected to the first power supply circuit board 14. A PC card "B" can be inserted into the digital camera 1 via the front and rear PC card guides 15a and 15b, as shown in FIG. 2.

The front and rear PC card guides 15a and 15b constitute a PC card receiving member (large memory card receiving member) 17 whose width in the forward/rearward direction is greater than that of the CF card receiving member 11. The front end of the PC card receiving member 17 is located in front of the front end of the CF card receiving member 11. The right end, with respect to FIG. 1, of the PC card receiving member 17 is flush with the right end of the CF card receiving member 11. Furthermore, the CF card receiving member 11 lies on a plane positioned above and parallel to the PC card receiving member 17. Namely, the CF card "A" is inserted in the CF card receiving member 11 along a plane which lies above and parallel to a plane along which the PC card "B" lies during insertion thereof into the PC card receiving member 17.

Figure 3:
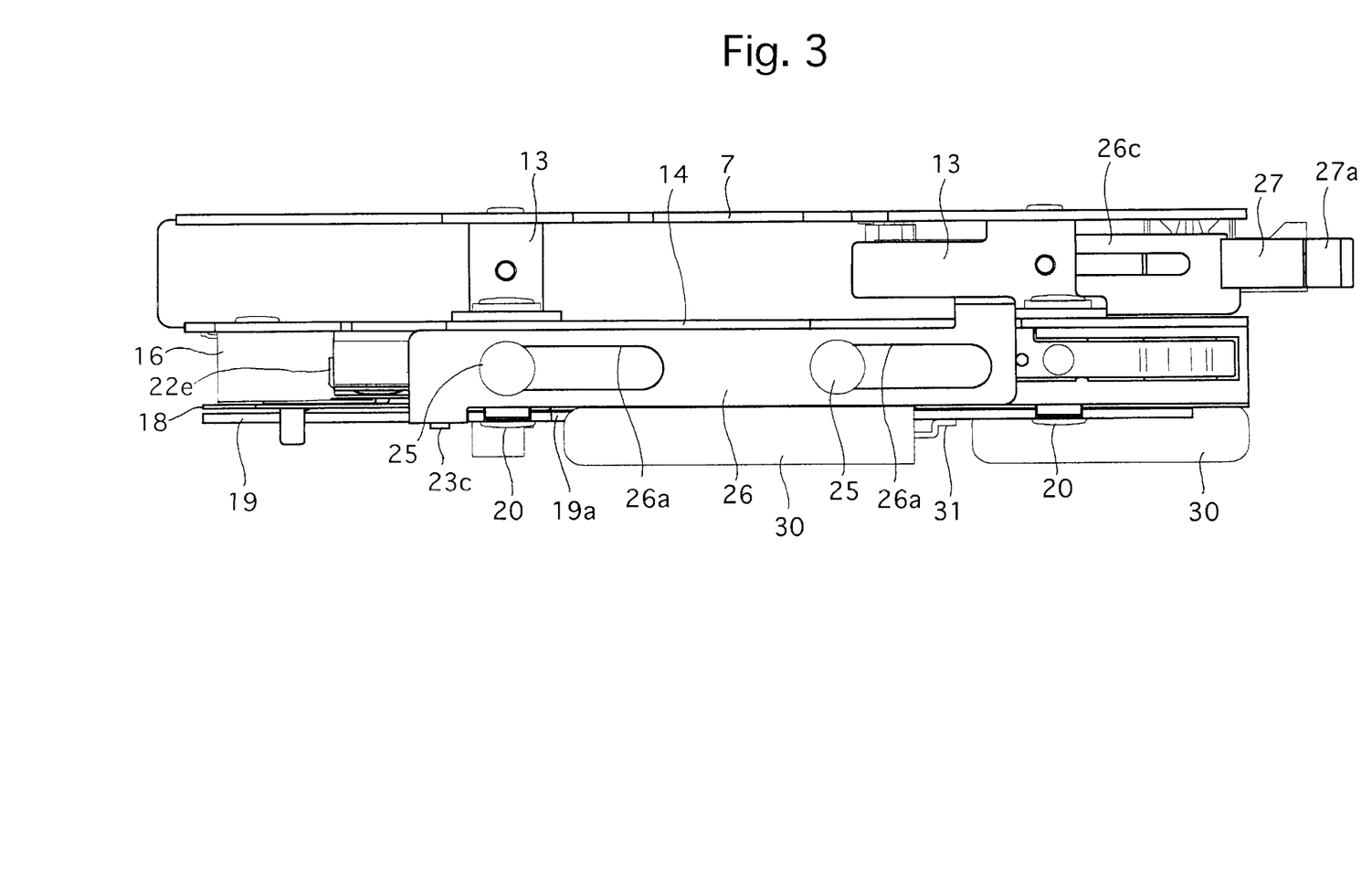
FIG. 3 is an enlarged front elevational view of a CF card receiving member, a PC card receiving member, and an ejection mechanism, etc., connected to each other through a plurality of substrates, according to the present invention.
Figure 4:
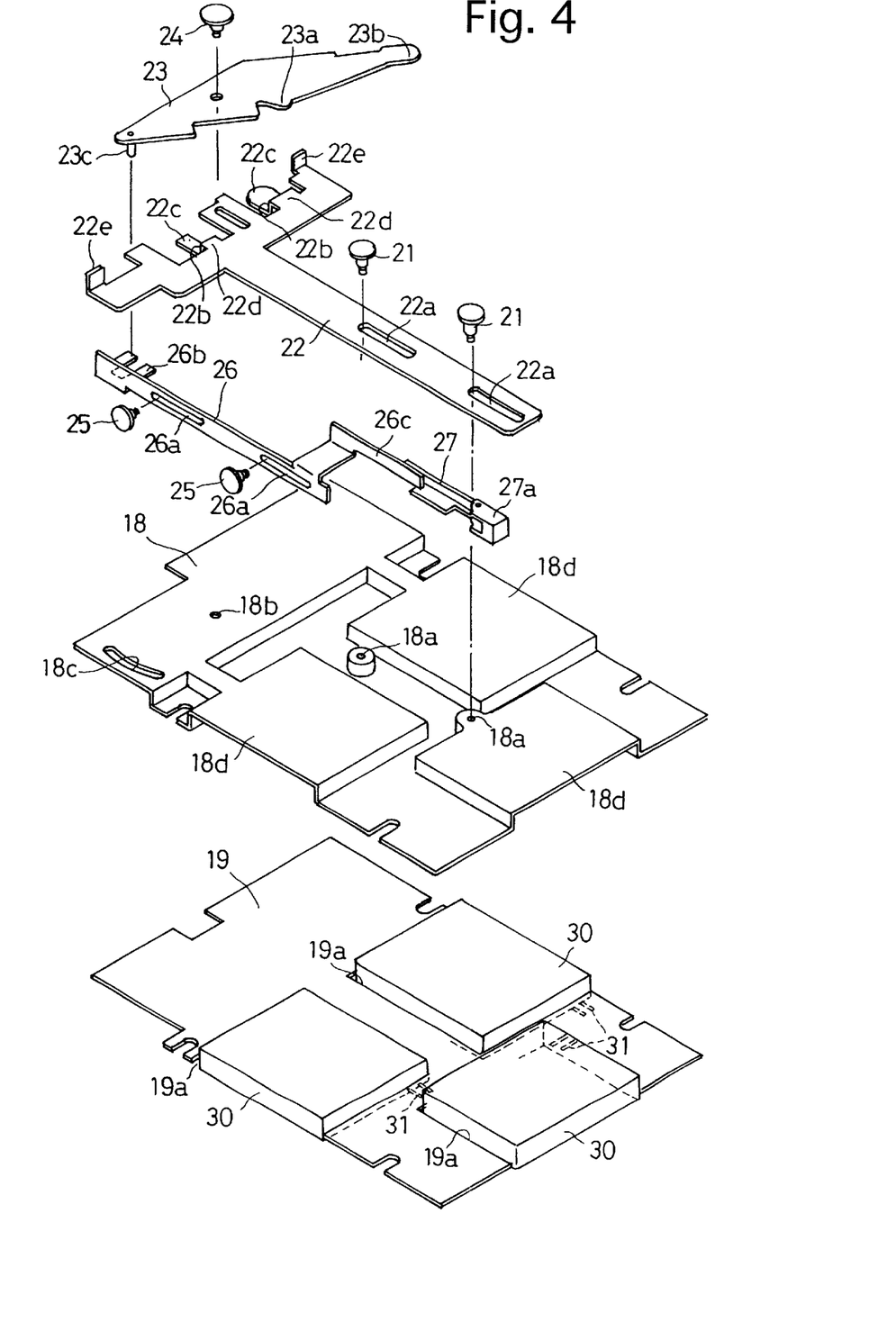
FIG. 4 is an exploded perspective view of an ejector, an ejector lever base-plate, and a second power supply circuit board, according to the present invention.
Figure 6:
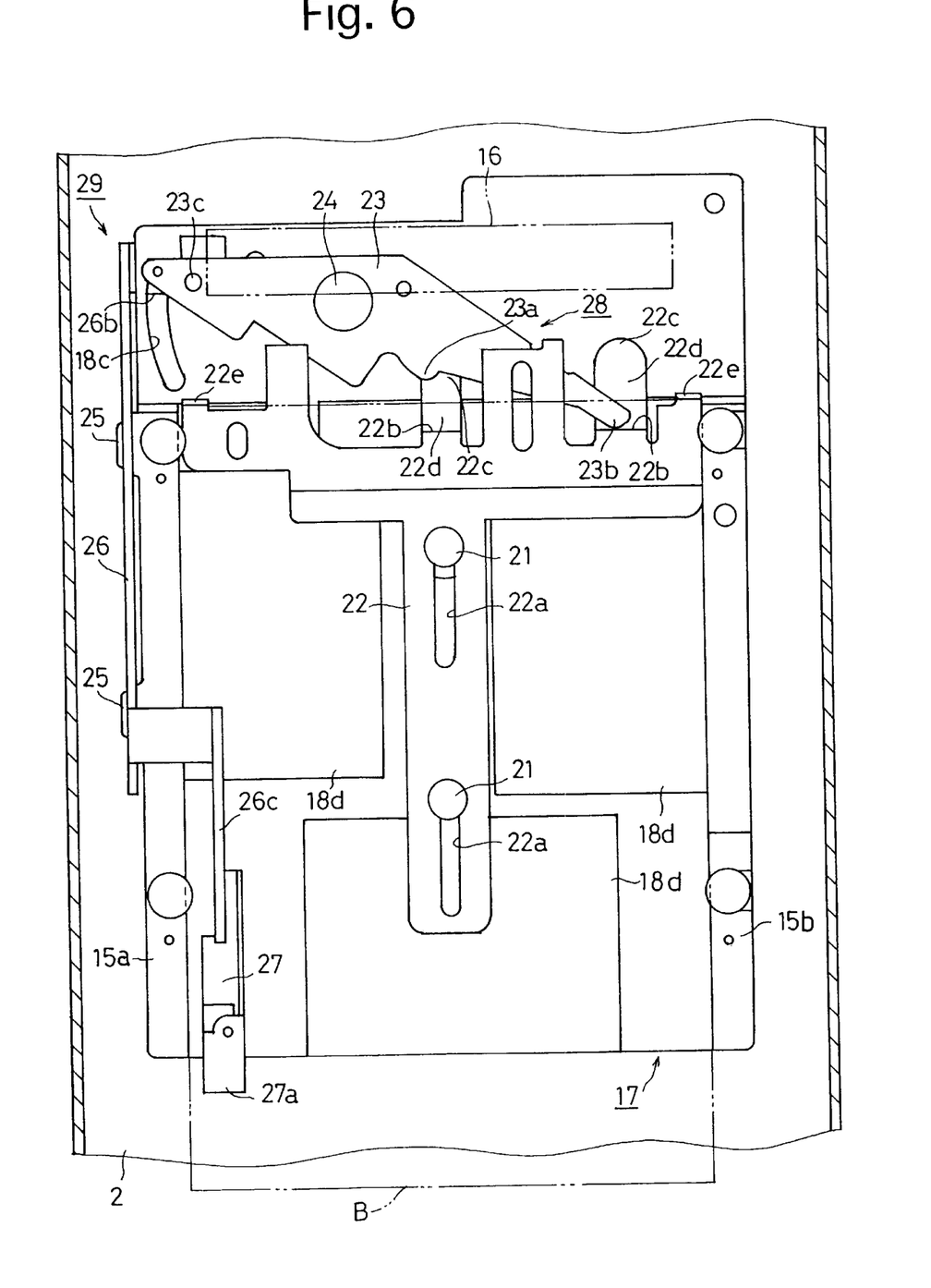
FIG. 6 is an enlarged cross sectional view similar to FIG. 5, showing a PC card disconnected from a PC card connector and ejected from a PC card receiving member, according to the present invention.
Figure 7:
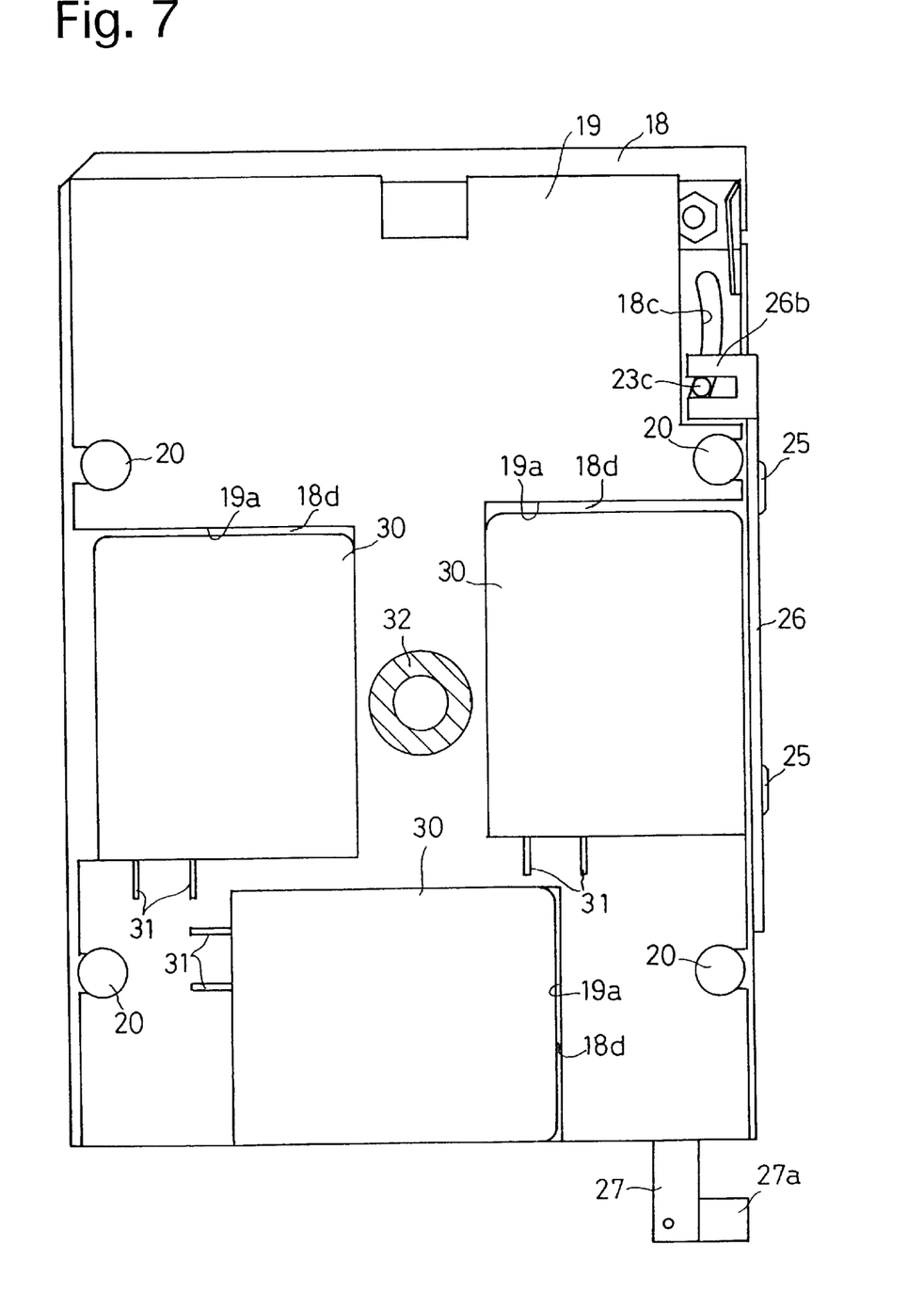
FIG. 7 is an enlarged bottom view taken along the line VII—VII in FIG. 2, with a camera body removed.

An ejector lever base-plate (magnetically shielded plate) 18 is laid on top of a second power supply circuit board 19 having a coil (not shown) thereon and are secured to the lower surfaces of the front and rear PC card guides 15a and 15b with screws 20 (see FIGS. 3 and 7). As shown in FIG. 4, the ejector lever base-plate 18, which is magnetically shielded, is provided on its center portion with a pair of right and left mount holes 18a in which pins 21 are fitted. The pins 21 are fitted in elongated holes 22a formed in an ejector plate 22 which has a substantially T-shaped construction in a plan view. The ejector plate 22 is provided on its left end (with respect to FIG. 4) with a pair of front and rear receiving portions 22d having downwardly extending vertical portions 22b and leftwardly extending (with respect to FIG. 4) horizontal portions 22c, and a pair of front and rear projecting portions 22e. The ejector plate 22 is movable in the lateral directions between a retracted position shown in FIG. 5 and a protruded position shown in FIG. 6.

As shown in FIG. 4, the ejector lever base-plate 18 is provided on its left end (with respect to FIG. 4) with a supporting hole 18b and an arched guide hole 18c whose center is located on the axis of the supporting hole 18b. An ejector lever 23 is rotatably attached at its center portion to the supporting hole 18b through a pin 24 fitted therein. The ejector lever 23 is provided, on its rear portion (with respect to the forward/rearward direction of the digital camera 1), with a pair of pressing portions 23a and 23b, and on the front end portion thereof, with a downwardly extending engagement pin 23c that is inserted in the guide hole 18c.

The ejector lever 23 abuts at the front pressing portion 23a against the vertical portion 22b of the front receiving portion 22d and is rotatable between a non-biasing position (FIG. 5) in which the ejector plate 22 is not biased and a biasing position (FIG. 6) in which the rear pressing portion 23b abuts against the rear vertical portion 22b to bias the ejector plate 22 toward the biasing position.

The front PC card guide 15a is provided on its front surface with a pair of right and left threaded holes (not shown) in which screws 25 are screw-engaged. The screws 25 are fitted in elongated holes 26a of a push rod 26 extending in the lateral direction. The push rod 26 is provided on its left end (with respect to FIG. 4) with an engagement portion 26b which is engaged by the engagement pin 23c, as shown in FIG. 7. The push rod 26 is linearly movable in the lateral direction between an inoperative position (FIGS. 5 and 7), in which the ejector lever 23 is moved to the non-biasing position, and an operative position (FIG. 6), in which the ejector lever 23 is moved to the biasing position.

The push rod 26 is provided on its right end with an ejector-button protrusion 26c which is bent to extend above the first power supply circuit board 14. As shown in FIG. 2, the ejector-button protrusion 26c is located at the front of the CF card receiving member 11. The ejector-button protrusion 26c is provided on the right end thereof (with respect to FIG. 4) with an ejector-button attachment 27 secured thereto, which is provided with an ejector button (rotatable operation member) 27a which normally extends perpendicularly to the ejector-button protrusion 26c when the ejector button 27a is not in use, and extends in the same direction as the ejector-button protrusion 26c when the ejector button 27a is in use.

The ejector lever base-plate 18, the ejector plate 22, and the ejector lever 23 constitute an ejector 28, and the ejector 28 together with the push rod 26 and the ejector-button attachment 27 constitute an ejection mechanism 29 for the PC card "B".

The second power supply circuit board 19 is electrically connected to the first power supply circuit board 14, and is provided with three square cut-away portions (openings) 19a, in which electric double layer condensers 30 are fitted, wherein the lower ends of the square cut-away portions 19a protrude downwardly from the second power supply circuit board 19, as shown in FIGS. 4 and 7. Terminals 31 of the electric double layer condensers 30 are soldered to connector terminals (not shown) of the second power supply circuit board 19. The second power supply circuit board 19 is electrically connected to the substrates 5, 6 and 7, so that the electricity supplied to the electric double layer condensers 30 can be supplied thereto.

The electric double layer condensers 30 which project upward slightly from the second power supply circuit board 19 are fitted in three corresponding recesses 18d formed in the ejector lever base-plate 18 and are adhered to the lower surfaces of the recesses 18d by double-sided adhesive tape (not shown). The lower portions of the electric double layer condensers 30 project downwardly from the second power supply circuit board 19 (see FIGS. 2 and 3).

The camera body 2 is provided with a strong main base-plate 32a to which a tripod threaded-hole 32 is firmly connected. As shown in FIG. 7, the tripod threaded-hole 32 is located in a space defined between the lower portions of the electric double layer condensers 30.

Figure 1:
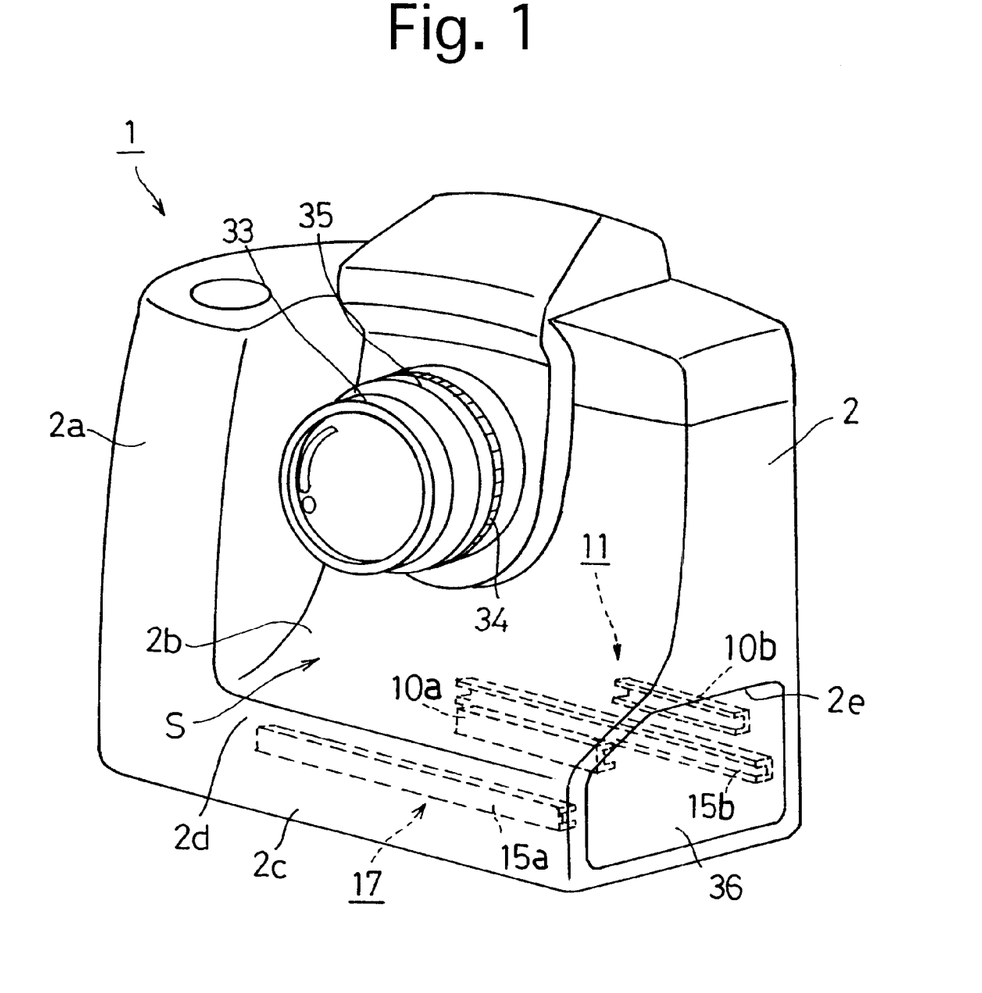
FIG. 1 is a perspective view of a digital camera according to an embodiment of the present invention.
Figure 2:
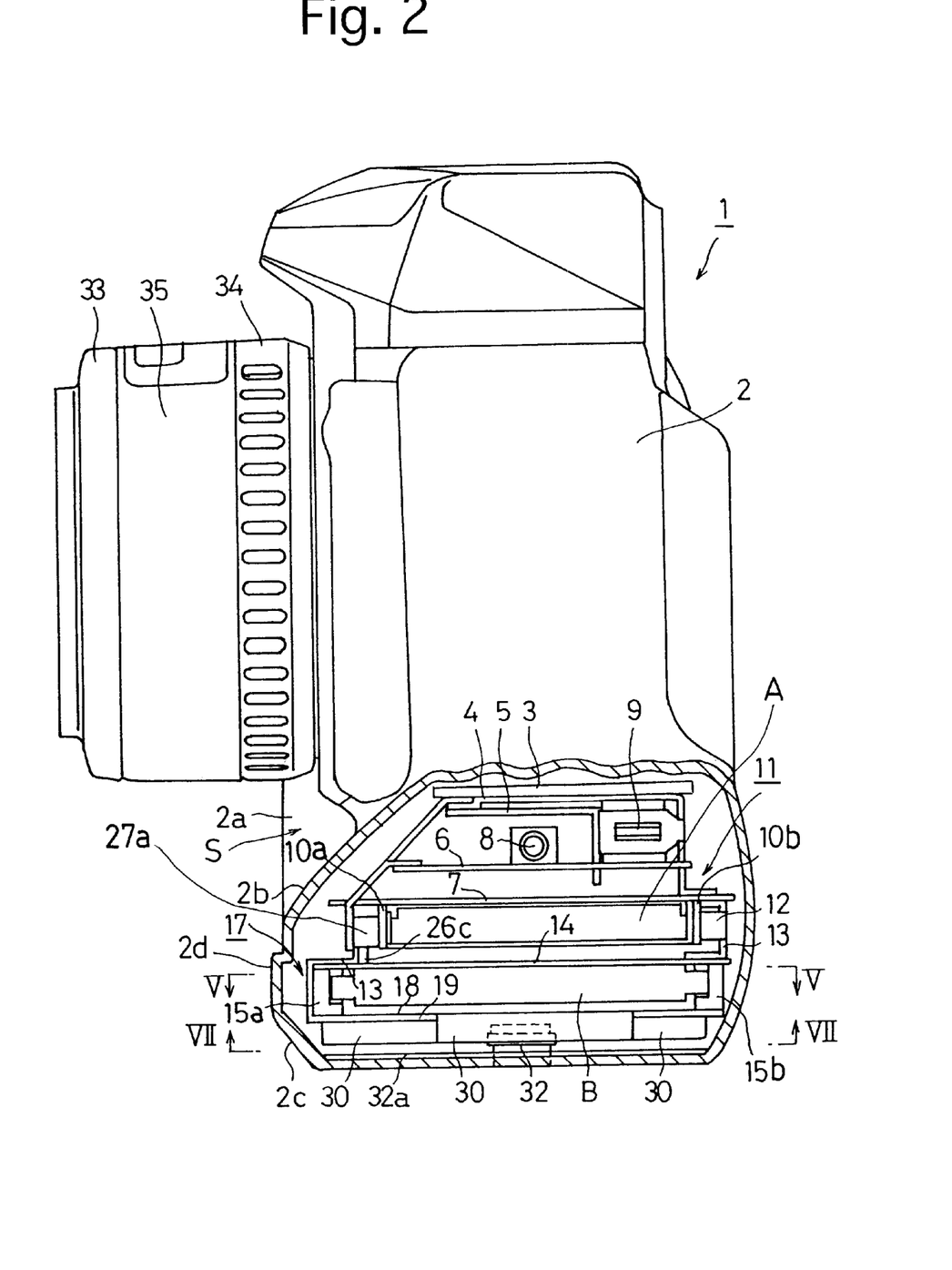
FIG. 2 is a partially broken side view of a digital camera shown in FIG. 1.

As can be seen in FIGS. 1 and 2, the camera body 2 is provided with a forwardly protruding grip portion 2a on the left side portion (with respect to FIG. 1) of the front surface of the camera body. The camera body 2 is also provided, on the lower portion of the front surface thereof, in addition to the grip portion 2a, with a inclined portion 2b which is inclined so that the amount of forward projection is gradually increased toward the bottom of the camera body. The bottom portion of the camera body forms a projecting portion 2c which is flush with the grip portion 2a. The inclined portion 2b and the projecting portion 2c constitute a forward projection 2d. As shown in FIG. 2, the CF card receiving member 11 is located in the inclined portion 2b and the PC card receiving member 17 is located in the projecting portion 2c.

A lens barrel 35 having a focusing ring 33 and a stop ring 34 is provided on the front surface of the camera body 2 and is located above the CF card receiving member 11.

The camera body 2 is provided, on the right and lower side portion thereof with respect to FIG. 1, with an opening 2e which is covered by a lid 36. The lid 36 can be closed to cover the opening 2e, and opened to expose the opening 2e.

When the lid 36 is open, not only can the PC card (large memory card) "B" and the CF card "A" be inserted therein and connected to the PC card connector 16 and the CF card connector, respectively, but also cables (not shown) can be connected to the video output terminal 8 and the external communication connector 9, as shown in FIG. 2.

When the ejector button 12 is depressed after the lid 36 is opened, the CF card connector is disconnected from the CF card "A", so that the CF card "A" can be removed from the CF card receiving member 11.

Figure 5:
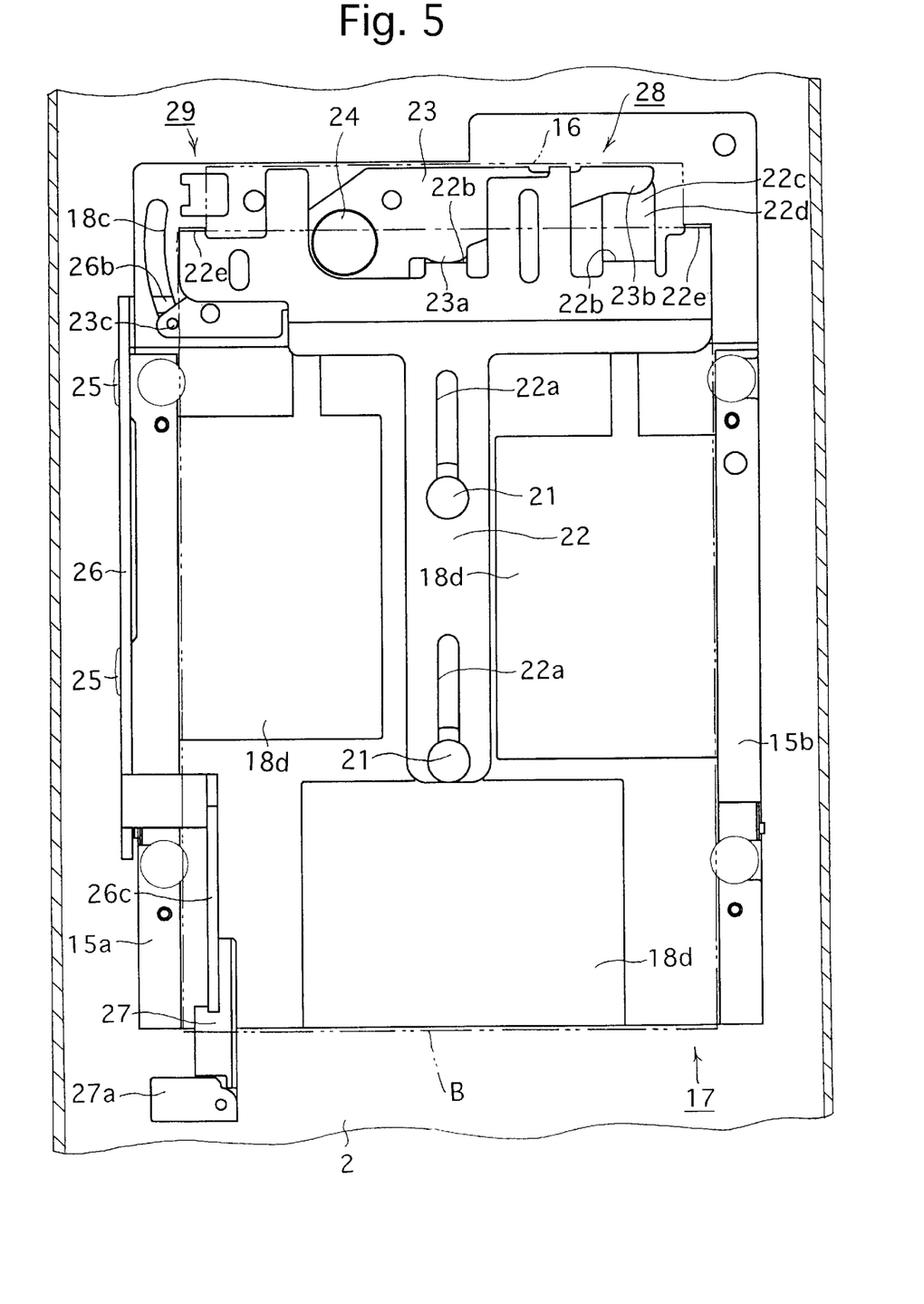
FIG. 5 is an enlarged cross sectional view taken along the line V—V in FIG. 2, showing a connection between a PC card and a PC card connector, according to the present invention.

If the lid 36 is opened when the PC card "B" is connected to the PC card connector 16, and if the operation member 27a is depressed in the lateral direction (in the left direction with respect to FIG. 1) upon the operation member 27a being moved so as to extend in the same direction as the ejector-button protrusion 26c, the ejector lever 23 is moved from the non-biasing position shown in FIG. 5, to the biasing position shown in FIG. 6. Consequently, the pressing portion 23b of the ejector lever 23 presses against the vertical portion 22b of the rear receiving portion 22d of the ejector plate 22 to thereby move the ejector plate 22 from the retracted position, shown in FIG. 5, to the protruded position shown in FIG. 6. Thus, the PC card "B" is disconnected from the PC card connector 16, so that the PC card "B" can be removed from the PC card receiving member 17.

In the digital camera 1 constructed as above, since the CF card "A" can be used together with the PC card "B" which has a large memory capacity, the storage capacity can be considerably increased, so that a large number of pictures can be taken without exchanging the PC card "B" or CF card "A".

Moreover, in the above-mentioned structure in which the projecting portion 2c and the inclined portion 2b are provided on the lower portion of the camera body 2, so that the front end of the C the PC card receiving member 17 is provided in the projecting portion 2c, and the CF card receiving member 11 is provided in the inclined portion 2b, CF card receiving member 11 extends shorter than the front end of the PC card receiving member 17, a large space S in which an operator's hand is accessible is formed between the lens barrel 35 and the projecting portion 2c. Consequently, the focusing ring 33 or the stop ring 34 provided on the lens barrel 35 can be easily operated utilizing the space S.

Moreover, since the lengths of the CF card receiving member 11 in the forward/rearward direction and the lateral direction are smaller than the corresponding lengths of the PC card receiving member 17, the lower substrate 7, to which the CF card receiving member 11 and the CF card connector are mounted, can be made smaller than the first power supply circuit board 14 to which the PC card receiving member 17 is mounted, even if other electrical elements (not shown) are mounted to the lower substrate 7. Consequently, the camera body 2 can be made small.

Furthermore, since the three electric double layer condensers 30 are mounted to the second power supply circuit board 19, it is possible to accumulate a large quantity of electricity at one time. Consequently, a flash (not shown) can be repeatedly operated.

The electric double layer condensers 30 are thick in the upward/downward direction. However, since the electric double layer condensers 30 are fitted in the cut-away portions 19a formed in the second power supply circuit board 19, the thickness of the second power supply circuit board 19 has no influence on the size of the camera body 2 in the upward/downward direction. Consequently, the size of the camera body 2 in the upward/downward direction can be reduced.

Since the tripod threaded-hole 32 is provided in a space surrounded by the electric double layer condensers 30, the size of the camera body 2 in the upward/downward direction can be reduced in comparison with an arrangement in which the tripod threaded-hole is located below or above the electric double layer condensers 30.

Furthermore, since the electric double layer condensers 30 are located as close to each other as possible on the second power supply circuit board 19 while not interfering with the tripod threaded-hole 32, the second power supply circuit board 19 can be made small, and hence, the size of the bottom of the camera body 2 can be reduced in the horizontal direction.

Moreover, the second power supply circuit board 19, on which a coil which produces noise is provided, is provided in bottom portion of the camera body 2, and the upper surface of the second power supply circuit board 19 is covered by the magnetically shielded ejector lever base-plate 18. Therefore, electric devices mounted on the upper, intermediate and lower substrates 5, 6 and 7, and the first power supply circuit board 14 are free from the noise produced by the coil.

Note that instead of a PC card, a PCT smart medium or the like can be used as a large memory card, a memory stick can be used as a small memory card, instead of a CF card.

Since the ejector-button protrusion 26c, and hence the ejector button 27a, of the push rod 26 to eject the PC card "B" from the PC card receiving member 17, having a large width in the forward/rearward direction, is provided in front of the CF card receiving member 11, and the ejector button 12 for the CF card "A" is provided behind the CF card receiving member 11, having a small width in the forward/rearward direction, the width of the camera body in the same direction can be reduced.

Moreover, the ejection mechanism 29 for the PC card is simply constructed from ejector lever base-plate 18, the ejector plate 22, the ejector lever 23, the push rod 26, and the ejector-button attachment 27, the ejection mechanism 29 can be manufactured less expensively.

As can be understood from the above discussion, not only can the size of the camera body in the horizontal direction be reduced by miniaturizing the power supply circuit board on which the electric double layer condensers are mounted, but also the thickness of the power supply circuit board in the upward/downward direction has no influence on the size of the camera body in the upward/downward direction because the electric double layer condensers are fitted in the openings of the power supply circuit board, and hence the camera body can be made small in the upward/downward directions.

Moreover, since the power supply circuit board, on which the electric double layer condensers are mounted and which produces noise, is provided in the bottom portion of the camera, electric devices provided on other substrates or circuit boards do not receive adverse effects from such noise.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A digital camera comprising:

a power supply battery;

an electric double layer condenser which accumulates a charge of electricity supplied from the battery; and a power supply circuit board, connected to said power supply battery, provided on a bottom portion of the digital camera body and lying substantially in parallel with the bottom side of the digital camera body, said power supply circuit board being provided with a cut-away portion;

wherein said electric double layer condenser is located in said cut-away portion and protrudes from at least one of upper and lower surfaces of the power supply circuit board; and wherein said electric double layer condenser is electrically connected to the power supply circuit board.

2. The digital camera according to claim 1, wherein a main base-plate having a threaded-hole for securing a tripod is arranged on the bottom of the camera body wherein the main base-plate lies on a plane parallel with the power supply circuit board;

wherein said threaded-hole and the electric double layer condenser are located at different positions with respect to said plane so as not to overlap each other in a direction normal to said plane; and wherein at least a part of said threaded-hole and said electric double layer condenser overlap each other in a direction parallel to said plane.

3. The digital camera according to claim 2, wherein said electric double layer condenser comprises a plurality of electric double layer condensers which are provided around the threaded-hole.

4. The digital camera according to claim 1, wherein an upper surface of the power supply circuit board is covered by a magnetically shielded plate.

* * * * *